United States Patent
Weidlich et al.

(10) Patent No.: US 11,953,571 B2
(45) Date of Patent: Apr. 9, 2024

(54) QUANTATATIVE MAGNETIC RESONANCE IMAGING IN THE PRESENCE OF FAT

(71) Applicant: KONINKLIJKE PHILIPS N.V., Eindhoven (NL)

(72) Inventors: Dominick Johannes Weidlich, Munich (DE); Stefan Ruschke, Hamburg (DE); Elizabeth Huaroc, Hamburg (DE); Mariya Ivanova Doneva, Hamburg (DE); Dimitrios Karampinos, Unterhaching (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/687,729

(22) Filed: Mar. 7, 2022

(65) Prior Publication Data
US 2022/0283252 A1    Sep. 8, 2022

(30) Foreign Application Priority Data
Mar. 8, 2021    (EP) .................... 21161328

(51) Int. Cl.
*G01R 33/48* (2006.01)
*G01R 33/56* (2006.01)

(52) U.S. Cl.
CPC ..... *G01R 33/4828* (2013.01); *G01R 33/4818* (2013.01); *G01R 33/5608* (2013.01)

(58) Field of Classification Search
CPC ............ G01R 33/4828; G01R 33/4818; G01R 33/5608; G01R 33/56527; G01R 33/4833; G01R 33/485; G01R 33/58; G01R 33/561; A61B 5/055; A61B 5/7267
See application file for complete search history.

(56) References Cited

U.S. PATENT DOCUMENTS
2019/0353731 A1    11/2019    Liu et al.

FOREIGN PATENT DOCUMENTS
IE    20170144 A2    9/2017
WO    WO-2017186768 A1 *    11/2017    ......... G01R 33/4816

OTHER PUBLICATIONS
Chen Y, Jiang Y, Pahwa S, Ma D, Lu L, Twieg MD, Wright KL, Seiberlich N, Griswold MA, Gulani V. MR Fingerprinting for Rapid Quantitative Abdominal Imaging. Radiology 2016;279(1):278-286.
(Continued)

*Primary Examiner* — Gregory H Curran (57) ABSTRACT

A medical system including a memory storing machine executable instructions is disclosed. The medical system also includes a computational system. The execution of the machine executable instructions causes the computational system to receive k-space data descriptive of a region of interest of a subject. The k-space data are acquired using a magnetic resonance fingerprinting pulse sequence configured for encoding chemical shifts. The execution of the machine executable instructions also causes the computational system to receive fat peak weights descriptive of a magnetic resonance fat spectrum. The fat peak weights are matched to a pulse train of the magnetic resonance fingerprinting pulse sequence. The execution of the machine executable instructions also causes the computational system to reconstruct a quantitative magnetic resonance image from the k-space data and the fat peak weights.

20 Claims, 5 Drawing Sheets

(56) References Cited

OTHER PUBLICATIONS

Jaubert O, Cruz G, Bustin A, Schneider T, Lavin B, Koken P, Hajhosseiny R, Doneva M, Rueckert D, Botnar RM, Prieto C. Water-fat Dixon cardiac magnetic resonance fingerprinting. Magn Reson Med 2019.

Marty B, Carlier PG. MR fingerprinting for water T1 and fat fraction quantification in fat infiltrated skeletal muscles. Magn Reson Med 2020;83(2):621-634.

Nolte T, Gross-Weege N, Doneva M, Koken P, Elevelt A, Truhn D, Kuhl C, Schulz V. Spiral blurring correction with water-fat separation for magnetic resonance fingerprinting in the breast. Magn Reson Med 2019.

Ostenson J, Damon BM, Welch EB. MR fingerprinting with simultaneous T1, T2, and fat signal fraction estimation with Integrated B0 correction reduces bias in water T1 and T2 estimates. Magn Reson Imaging 2019;60:7-19.

Cencini M, Biagi L, Kaggie JD, Schulte RF, Tosetti M, Buonincontri G. Magnetic resonance fingerprinting with dictionary-based fat and water separation (DBFW MRF): A multi-component approach. Magn Reson Med 2019;81 5):3032-3045.

Weidlich D, Diefenbach, M., Schlaeger, S., Hock, A., Ruschke, S., Karampinos, D.C. In-vivo water T2 mapping in tissues containing water and fat using a T2-prepared 3D Dixon TSE sequence and a pre-calibrated fat spectrum model. 2018. p 4223.

Schlaeger S, Weidlich, D., Klupp, E., Montagnese, F., Deschauer, M., Schoser, B., Bublitz, S., Zimmer, C., Rummeny, E.J., Kirschke, U.S., Karampinos, D.C. Water T2 mapping in fatty infiltrated thigh muscles of patients with neuromuscular diseases using a T2-prepared 3D Tse with SPAIR. 2018. p. 0815.

Jaubert et al "T1, T2, and Fat Fraction Cardiac MR Fingerprinting: Preliminary Clinical Evaluation" J. Magn. Reson. Imaging 2020.

Tamada et al "Mapping T1, T2 and Proton Density Fat Fraction of the Liver Using MR Fingerprinting with three-point Dixon and 6-Peak Fat Model" ISMRM Annual Meeting May 2019.

Anderson et al "Single Point Dixon Reconstruction of Whole-Body Scans using a Convolutional Neural Network" Proceedings of the 26th Annual Meeting of ISMRM (2018).

Huaroc et al "On the Effect of Fat Spectrum Complexity in Dixon MR Fingerprinting" ISMRM Annual Meeting May 15, 2021.

\* cited by examiner

QUANTATATIVE MAGNETIC RESONANCE IMAGING IN THE PRESENCE OF FAT

CROSS-REFERENCE TO PRIOR APPLICATIONS

This application claims the benefit of European Patent Application No. 21161328.6 filed on Mar. 8, 2021. This application is hereby incorporated by reference herein.

FIELD OF THE INVENTION

The invention relates to magnetic resonance imaging, in particular to quantitative magnetic resonance imaging in the presence of fat.

BACKGROUND OF THE INVENTION

In quantitative magnetic resonance imaging measurement of the magnetic moments within a subject are used to determine spatially varying maps or images of tissue types and properties of a subject. Quantitative magnetic resonance imaging techniques enable the simultaneous extraction of multiple parameters include Magnetic Resonance Fingerprinting (MRF) and model-based reconstructions based on simulations of the Bloch equation such as Magnetic Resonance Spin TomogrAphy in Time domain (MR-STAT).

The journal article Cencini, Matteo, et al. "Magnetic resonance fingerprinting with dictionary-based fat and water separation (DBFW MRF): a multi-component approach." Magnetic resonance in medicine 81.5 (2019): 3032-3045 discloses an MR fingerprinting (MRF) framework that uses a single dictionary combination of a water and fat dictionary. A variable TE acquisition pattern with maximum TE=4.8 ms was used to increase the fat-water separability. Radiofrequency (RF) spoiling was used to reduce the size of the dictionary by reducing T2 sensitivity. The technique was compared both in vitro and in vivo to an MRF method that incorporated 3-point Dixon (DIXON MRF), as well as Cartesian IDEAL with different acquisition parameters. The ISMRM-2018 abstract 'In vivo water $T_2$-mapping in tissues containing water and fat using a T2-prepared 3D Dixon TSE sequence and a pre-calibrated fat spectrum model', by D. Weidlich et al. concerns to determine water $T_2$ and separate the effects of water and fat. The T2-weighted fat amplitudes are acquired by a $T_2$-prep MR spectroscopy sequence (MRS) for each $T_2$-weighting.

SUMMARY OF THE INVENTION

The invention provides for a medical system, a computer program and a method in the independent claims. Embodiments are given in the dependent claims.

A difficulty in performing quantitative magnetic resonance imaging techniques is that the magnetization flip angle train used during the acquisition of k-space data can cause the J-couplings between the various protons within the fatty acids to interact. As a result of this the modulation of the various fat peaks in the magnetic resonance spectrum due to T1 and T2 relaxation and J coupling effects is not known for a particular pulse sequence. As a result, the separation between the water and fat separation of the magnetic resonance signal are not really known. This may lead to errors in calculated quantitative magnetic resonance images. The quality of the calculated quantitative magnetic resonance images may be improved by using fat peak weights that are either measured at the same time as the k-space data or were pre-calibrated for that particular pulse sequence.

In one aspect the invention provides for a medical system that comprises a memory storing machine-executable instructions. The medical system further comprises a computational system. A computational system here is intended to represent one or more computing cores or locations that may be located within a single machine or distributed amongst multiple machines. Execution of the machine-executable instructions causes the computational system to receive k-space data descriptive of a region of interest of a subject. The k-space data is acquired using a magnetic resonance fingerprinting pulse sequence that is configured for encoding chemical shifts. A magnetic resonance fingerprinting pulse sequence configured for encoding chemical shifts could comprise the acquisition of the k-space data at various echo times, which enables the encoding of chemical shifts.

The magnetic resonance fingerprinting pulse sequence is a pulse sequence that is configured for controlling a magnetic resonance imaging system to acquire k-space data according to a magnetic resonance fingerprinting protocol. The k-space data can be used to reconstruct a quantitative magnetic resonance image using not only a Magnetic Resonance Fingerprinting (MRF) reconstruction. A model-based reconstruction or a neural network can also be used to perform the reconstruction.

Execution of the machine-executable instructions further causes the computational system to receive fat peak weights descriptive of a magnetic resonance fat spectrum. The fat peak weights are matched to the pulse train of the magnetic resonance fingerprinting pulse sequence. The magnetization of the fat or adipose tissue affects the value of the fat peak weights. The fat peak weights therefore are tailored or measured specifically for the pulse train of the magnetic resonance fingerprinting pulse sequence. That is, the fat peak weights are received for respective MRF signal train segments. The reconstruction involves a water-fat separation for the respective MRF signal train segments based on the proper fat peak weights associated with the MRF signal train segment at issue. Further, the reconstruction involves a MRF dictionary comparison for the water separated components of the MRF signal train segments Execution of the machine-executable instructions further causes the computational system to reconstruct a quantitative magnetic resonance image from the k-space data and the fat peak weights.

The fat peaks weights may be obtained for multiple selected individual MRF signal train segments by way of MR-spectroscopy measurements subsequent to the acquisition of the MRF signal train segment at issue. Additional fat peak weights for MRF signal train segments may be obtained from MR spectral measurements e.g. by interpolation between fat peaks weights for neighbouring selected MRF signal trains. This approach accounts for variation of the fat peak weights with the lengths of preceding spin manipulations associated with the MRF signal train acquisitions that depend on the length of the preceded acquisitions of the MRF signal train segments. This includes dephasing and relaxation effects. An insight of the present invention is that as MRF signal train acquisition proceeds form segment to segment, the effective fat spectrum varies due to differences in dephasing and relaxation caused by the varying spin magnetisation state and different response among protons at chemically different positions in the fat molecules. To account for these variations, the fat peak weights are updated from time to time e.g. on the basis of MR spectroscopy information that accounts for the varying spin magnetisation states due to preceding MRF signal train acquisitions.

There are a variety of ways of reconstructing the quantitative magnetic resonance image. One is the use of a magnetic resonance fingerprinting reconstruction where a dictionary is used. Another is where a neural network may use either directly the measured k-space data and the fat peak weights as input to output the quantitative magnetic resonance image. In yet another example, the k-space data and the fat peak weights can be input into a model-based reconstruction. For example, a non-linear version of the k-space data that is consistent with Bloch's equation and Faraday's law can be used for the model-based reconstruction.

This embodiment may be beneficial because assumed or standard values for the fat peak weights are typically used. This can lead to errors in quantitative magnetic resonance imaging. A specific example of this is known as MRF Dixon magnetic resonance imaging. When performing conventional Dixon reconstructions, an assumed value for the fat peak weights is successfully used. This may function well for conventional Dixon magnetic resonance imaging, however when applied to a pulse sequence that is configured for doing magnetic resonance fingerprinting the quantitative magnetic resonance image may have errors due to the modulation of the fat peaks mentioned above.

In another embodiment the medical system further comprises a magnetic resonance imaging system. The memory further stores the magnetic resonance fingerprinting pulse sequence. This is the pulse sequence that is configured for encoding chemical shifts. Execution of the machine-executable instructions further causes the computational system to control the magnetic resonance imaging system to acquire the k-space data.

In another embodiment the magnetic resonance fingerprinting pulse sequence is further configured to acquire at least one magnetic resonance spectroscopic measurement during the acquisition of the k-space data from a measurement volume within the region of interest by performing a magnetic resonance spectroscopy readout sequence. The method further comprises calculating the fat peak weights from the at least one magnetic resonance imaging spectroscopic measurement. This embodiment may be beneficial because that fat peak weights are obtained not only for the specific pulse sequence that is used but also for the particular subject. This may lead to a quantitative magnetic resonance image that is more accurate.

In another embodiment the measurement volume is a single voxel. The magnetic resonance spectroscopy readout sequence is a single-voxel magnetic resonance spectroscopy readout sequence. For example, a particular region of adipose tissue of the subject could be selected and the measurement volume could be a single voxel selected from this adipose region. This may lead to a highly accurate measurement that is acquired rapidly. This could be performed multiple times or it could be performed a single time during the process of acquiring all of the k-space data.

In another embodiment the single-voxel magnetic resonance spectroscopy readout sequence is a point-resolved spectroscopy readout sequence.

In another embodiment the single-voxel magnetic resonance spectroscopy readout sequence is a stimulated echo acquisition mode readout sequence.

In another embodiment the single-voxel magnetic resonance spectroscopy readout sequence is a laser spectroscopic readout sequence.

In another embodiment the single-voxel magnetic resonance spectroscopy readout sequence is a semi-laser spectroscopic readout sequence.

In another embodiment the magnetic resonance fingerprinting pulse sequence is configured to excite a spatially selected excitation volume during acquisition of the k-space data. The measurement volume is the entire excitation volume. The magnetic resonance spectroscopy readout sequence is a non-spatially selected magnetic resonance spectroscopy readout sequence that averages the entire spatially selected excitation volume. For example, when a single TR or pulse repetition is repeated there will be a spatially selected excitation volume. After the measurement is performed a non-spatially selected magnetic resonance spectroscopy readout sequence can be used that averages this entire region that was excited. This may be beneficial because it may provide a good average value for calculating the fat peak weights.

In another embodiment the magnetic resonance fingerprinting pulse sequence is configured such that at least one pulse train is followed by the magnetic resonance imaging spectroscopy readout sequence. This embodiment is beneficial because the magnetic resonance spectroscopy readout sequence may be tacked onto one or more repetitions of the pulse sequence. For example, they could be performed after the pulse train of a magnetic resonance fingerprinting pulse sequence and the correct magnetization will exist when the spectroscopic measurements are made.

In another embodiment the magnetic resonance fingerprinting pulse sequence is further configured for performing a tip-up module (between the magnetic resonance fingerprinting flip-angle train and the magnetic resonance imaging spectroscopy readout sequence. This embodiment may be beneficial because it enables the magnetic resonance imaging spectroscopy readout sequence to be combined with the previous measurements. For example, there is no need to perform an additional spatially selected excitation of a volume.

In another embodiment the magnetic resonance fingerprinting pulse sequence is configured for acquiring the k-space data as groups of k-space data. The magnetic resonance fingerprinting pulse sequence is configured for acquiring the magnetic resonance imaging spectroscopic measurement fewer times than the number of groups of k-space data. Execution of the machine-executable instructions further causes the computational system to estimate the set of fat peak weights for the groups of the k-space data which do not comprise magnetic resonance imaging spectroscopic measurements. One way of doing these spectroscopic measurements would be to have the magnetic resonance imaging spectroscopic measurement performed after every acquisition of a group of k-space data. This however may lead to an increase in the time required to perform a procedure. It however would be expected that the fat peak weights would be smoothly varying between the various acquisitions of a group of k-space data. To accelerate this process, the magnetic resonance imaging spectroscopic measurement is acquired for a number less than the number of acquisitions or groups.

In another embodiment the set of fat peak weights is calculated from the at least one magnetic resonance spectroscopic measurement using a time domain based peak fitting algorithm.

In another embodiment the set of fat peak weights is calculated from the at least one magnetic resonance spectroscopic measurement using a frequency domain based peak fitting algorithm.

In another embodiment execution of the machine-executable instructions further causes the processor to receive the fat peak weights by retrieving it from a fat peak weights database. For example, the k-space data may be accompanied by meta data which describes the type of magnetic resonance fingerprinting pulse sequence that it was configured for or how the data was acquired. This could then be used to search and retrieve from a database that contains the fat peak weights for that particular pulse sequence. This for example would enable pre-calibration and eliminate the need to measure spectroscopic measurements on the subject themselves.

In another embodiment the k-space data comprises meta data. For example, the meta data may be descriptive of the magnetic resonance fingerprinting pulse sequence. As was mentioned above, this may be used for searching for the particular fat peak weights to use.

In another embodiment the meta data itself contains the fat peak weights, so in this way the fat peak weights are paired or associated with the magnetic resonance fingerprinting pulse sequence that was used to acquire the k-space data.

In another embodiment the memory further contains a magnetic resonance fingerprinting dictionary for one or more intrinsic properties of the subject. The intrinsic properties could be any one of a variety of properties which are typically used for magnetic resonance fingerprinting. For example, they could be T1 values, T2 values, tissue types as well as other tissue properties. Execution of the machine-executable instructions further causes the computational system to reconstruct the quantitative magnetic resonance image from the k-space data and the fat peak weights by first providing a set of magnetic resonance fingerprints for the region of interest by reconstructing a sequence of images from the k-space data using the set of fat peak weights. In this case for each of the pulse train there is an image or k-space data for an image that is acquired. This is then reconstructed into an image and then a sequence of images is formed. The magnetic resonance fingerprint can either be dealt with in one of several different ways. It can for example just be the collection of images in the sequence. In another example, the magnetic resonance fingerprint is constructed by taking the corresponding voxels from each of the sequence of images and a vector can be constructed for each voxel.

Execution of the machine-executable instructions further causes the computational system to calculate a spatially dependent map for at least one of the intrinsic properties by matching the set of chemical shift encoding-sensitive magnetic resonance fingerprints to the magnetic resonance fingerprinting dictionary. This for example would be the classical or typical magnetic resonance fingerprinting. The difference is that the fingerprints were not just reconstructed using the k-space data but also using the set of fat peak weights.

In another embodiment the sequence of images is a sequence of fat and water images reconstructed according to a Dixon magnetic resonance imaging protocol. In this case the magnetic resonance fingerprinting pulse sequence is a Dixon magnetic resonance fingerprinting pulse sequence.

In another embodiment the one or more intrinsic properties of the subject comprise a T1 relaxation time.

In another embodiment the one or more intrinsic properties of the subject comprises a T2 relaxation time.

In another embodiment the intrinsic properties of the subject comprise a T2-star relaxation time.

In another embodiment the one or more intrinsic properties comprise an R2-star relaxation time.

In another embodiment the one or more intrinsic properties of the subject comprise a voxel fat fraction.

In another embodiment the one or more intrinsic properties of the subject comprise a diffusion coefficient.

In another embodiment the one or more intrinsic properties of the subject comprise an apparent diffusion coefficient.

In another embodiment the one or more intrinsic properties of the subject comprise a magnetization transfer coefficient or coefficients.

In another embodiment the one or more intrinsic properties of the subject comprise a fat magnetization value.

In another embodiment the one or more intrinsic properties of the subject comprise a tissue type.

In another embodiment the quantitative magnetic resonance image is reconstructed from the k-space data and the fat peak weights directly by performing the solution of a non-linear inversion of the k-space data that is consistent with Bloch's equation and Faraday's law. This technique is also sometimes referred to as the MR-STAT technique. It is similar to magnetic resonance fingerprinting except it is essentially an optimization that is performed on the k-space data instead of working in image space.

In another embodiment the quantitative magnetic resonance image is reconstructed from the k-space data and the fat peak weights directly by receiving the quantitative magnetic resonance image in response to inputting the k-space data and the fat peak weights into a neural network. Instead of solving for the quantitative magnetic resonance image analytically, a neural network can be trained to do this also.

The neural network could for example be a trained neural network that is trained by taking k-space data and fat peak weights and then calculating a training quantitative magnetic resonance image using a magnetic resonance fingerprinting technique that uses a magnetic resonance fingerprinting dictionary. The k-space data and the fat peak weights could then be inputted into the neural network and the output could then be compared to the training quantitative magnetic resonance image generated via the magnetic resonance fingerprinting. This could then be used for deep learning to train the neural network. Another way of performing this would be to take measurements on known phantoms that have spatially different intrinsic properties. Because the properties of the phantoms are known in advance a training spatially dependent map of the intrinsic properties could be constructed. This could be used with measured k-space data from the phantoms to perform deep learning also.

In another embodiment the magnetic resonance fingerprinting pulse sequence is a Dixon magnetic resonance fingerprinting sequence. This embodiment may be beneficial because Dixon is a useful way of suppressing fat signals. However, the Dixon sequences or reconstruction makes assumptions about the fat peak weights that cause errors when magnetic resonance fingerprinting is performed.

In another aspect the invention provides for a computer program that comprises machine-executable instructions for execution by a computational system. Execution of the machine-executable instructions further causes the computational system to receive k-space data descriptive of a region of interest of a subject. The k-space data is acquired using a magnetic resonance fingerprinting pulse sequence configured for encoding chemical shifts. Execution of the machine-executable instructions further causes the computational system to receive fat peak weights descriptive of a magnetic resonance fat spectrum. The fat peak weights are matched to the pulse train of the magnetic resonance fingerprinting pulse sequence. Execution of the machine-executable instructions further causes the computational system to reconstruct a quantitative magnetic resonance image from the k-space data and the fat peak weights.

In another aspect the invention provides for a method of medical imaging. The method comprises receiving k-space data descriptive of a region of interest of the subject. The k-space data is acquired using a magnetic resonance fingerprinting pulse sequence configured for encoding chemical shifts. The method further comprises receiving fat peak weights descriptive of a magnetic resonance fat spectrum. The fat peak weights are matched to the pulse train of the magnetic resonance fingerprinting pulse sequence. The method further comprises reconstructing a quantitative magnetic resonance image from the k-space data and the fat peak weights.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object oriented programming language such as Java, Python, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a computational system of a general-purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a magnetic resonance apparatus during a magnetic resonance imaging scan. Magnetic resonance data is an example of tomographic medical image data.

A Magnetic Resonance Imaging (MRI) image or MR image is defined herein as being the reconstructed two- or three-dimensional visualization of anatomic data contained within the magnetic resonance imaging data. This visualization can be performed using a computer.

As an example, the fat peak weights are often expressed in the literature as $\alpha_p$, with p representing a particular fat peak. For example, signal for a fully-sampled multi-echo cartesian MRF acquisition at the echo time $TE_n$ and after each magnetic resonance finger printing train segment or instance i $MRF_i$ is:

$$s(TE_n, MRF_i) = W_0 e^{i\phi_{Wo}} \psi(MRF_i, T_{1W}, T_{2W}) e^{(i\omega_W - R_W)TE_n} + \Sigma_{p=1}^{P} \alpha_p F_0 e^{i\phi_{Fo}} \psi(MRF_i, T_{1p}, T_{2p}) e^{(i\omega_p - R_p)TE_n}$$

Where $W_0$ is the proton density of water, $\psi(\ )$ represent an MRF fingerprint of a given chemical species and has a dimension of the MRF pulse train, $F_0$ is the proton density of fat, $\phi_{Wo}$ is the initial phase after excitation of water $T_{1W}$ is the T1 value of water, $T_{2W}$ is the T2 value of water, $\omega_W$ is the relative frequency including the field map term of water, $R_W$ is the transverse relaxation rate of water, $\phi_{Fo}$ is the initial phase after excitation of the pth fat peak, $T_{1p}$ is the T1 value for the pth fat peak, $T_{2p}$ is the T2 for the pth fat peak, $\omega_p$ is the relative frequency including the field map term of the pth fat peak, and $R_p$ is the transverse relaxation rate of the pth fat peak. The $T_{1p}$ and $T_{2p}$ values specify the proton type for $\psi(\ )$. The present invention may be implemented in that the fat spectrum is updated from MR spectroscopy measurements in that the quantity $\Sigma_{p=1}^{P} \alpha_p F_0 e^{i\phi_{Fo}} \psi(MRF_i, T_{1p}, T_{2p})$ is updated for respective MRF signal train segments $MRF_i$.

The above equation therefore includes the MRF fingerprint in the water and fat signals. As can be seen in the above equation, if the value of $\alpha_p$ for the individual fat peaks p are not known the signal will be modeled incorrectly.

BRIEF DESCRIPTION OF THE DRAWINGS

In the following preferred embodiments of the invention will be described, by way of example only, and with reference to the drawings in which.

DESCRIPTION OF EMBODIMENTS

Like numbered elements in these figures are either equivalent elements or perform the same function. Elements which have been discussed previously will not necessarily be discussed in later figures if the function is equivalent.

Figure 1:
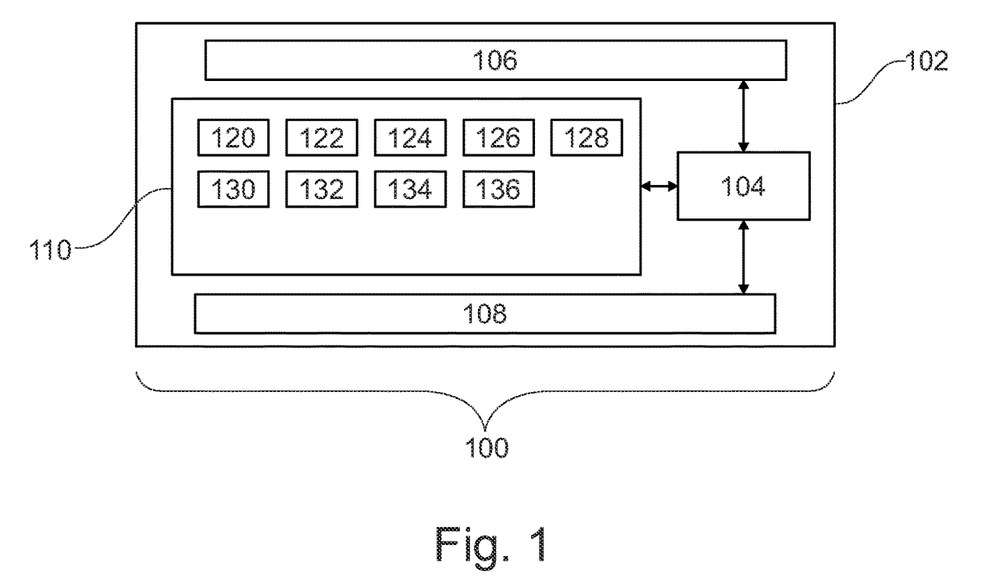
FIG. 1 illustrates an example of a medical instrument.

FIG. 1 illustrates an example of a medical system 100. In this example the medical system 100 comprises a computer 102 with a computational system 104. The computational system 104 is intended to represent one or more computer or computational or processing cores that may be located in one or more locations. The computer 102 is further shown as containing an optional hardware interface 106 and an optional user interface 108. The hardware interface 106 may be used to communicate and control other components of the medical system 100 if they are present. The user interface 108 may enable an operator to control the operation and function of the medical system 100.

The computational system 104 is in communication with the hardware interface 106, the user interface 108 and also a memory 110. The memory 110 is intended to represent various types of memories which are in communication with the computational system 104.

The memory 110 is shown as containing machine-executable instructions 120. The machine-executable instructions 120 enable the computational system 104 to perform very basic computational and image processing techniques as well as also perform control functions in controlling other components. The memory 110 is further shown as containing k-space data that is descriptive of a region of interest of a subject and is acquired using the magnetic resonance fingerprinting pulse sequence that was configured for encoding chemical shifts. The memory 110 may for example contain optional meta data 124 that is descriptive of identifies the particular magnetic resonance fingerprinting pulse sequence that was configured for encoding chemical shifts. The memory 110 is further shown as containing some fat peak weights 126 that may be matched or paired to the k-space data 122. They for example are fat peak weights 126 that match the magnetic resonance fingerprinting pulse sequence. The fat peak weights 126 could for example be retrieved from an optional fat peak weights database using the meta data 124. In another example the fat peak weights 126 could be provided with the k-space data 122 so that they are paired.

The memory is further shown as containing an image reconstruction module 130 that is configured for receiving the k-space data 122 and the fat peak weights 126 and outputting a quantitative magnetic resonance image 132. The image reconstruction module 130 could be implemented in a variety of ways. In one example it could be a neural network, a trained neural network, that is trained to receive the k-space data 122 and the fat peak weights 126 and in response output the quantitative magnetic resonance image 132. In another example, the image reconstruction module 130 could be a module that implements a magnetic resonance fingerprinting protocol that uses an optional set of magnetic resonance fingerprints 134 reconstructed from the k-space data 122 and the fat peak weights 126 and then matches the set of magnetic resonance fingerprints 134 using an optional magnetic resonance fingerprinting dictionary 136.

In yet another example the image reconstruction module 130 could be a module that uses the k-space data 122 and the fat peak weights 126 to solve a non-linear inversion of the k-space data that is consistent with Bloch's equation and Faraday's law. This may also be referred to as an MR-STAT image reconstruction module.

Figure 2:
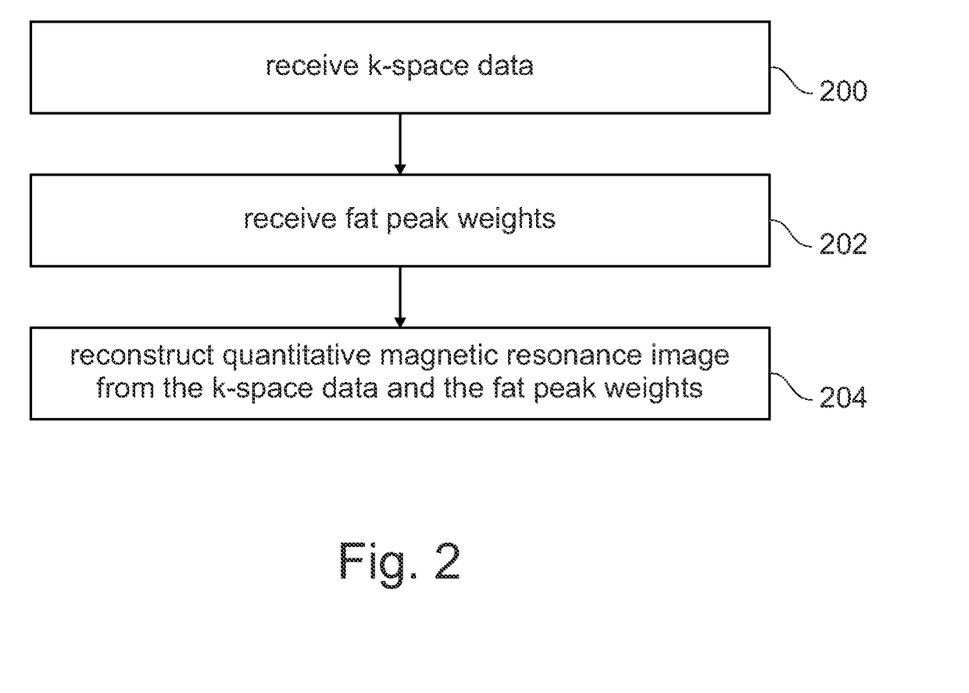
FIG. 2 shows a flow chart which illustrates a method of using the medical instrument of FIG. 1.

FIG. 2 shows a flowchart which illustrates a method of operating the computational system 100 of FIG. 1. First, in step 200, the k-space data 122 is received. The k-space data is descriptive of a region of interest of a subject. Next, in step 202, fat peak weights 126 are received which are descriptive of a magnetic resonance fat spectrum and they are matched to the pulse train of the magnetic resonance fingerprinting pulse sequence used to acquire the k-space data. Finally in step 204, the quantitative magnetic resonance image 132 is reconstructed using both the k-space data 122 and the fat peak weights 126.

Figure 3:
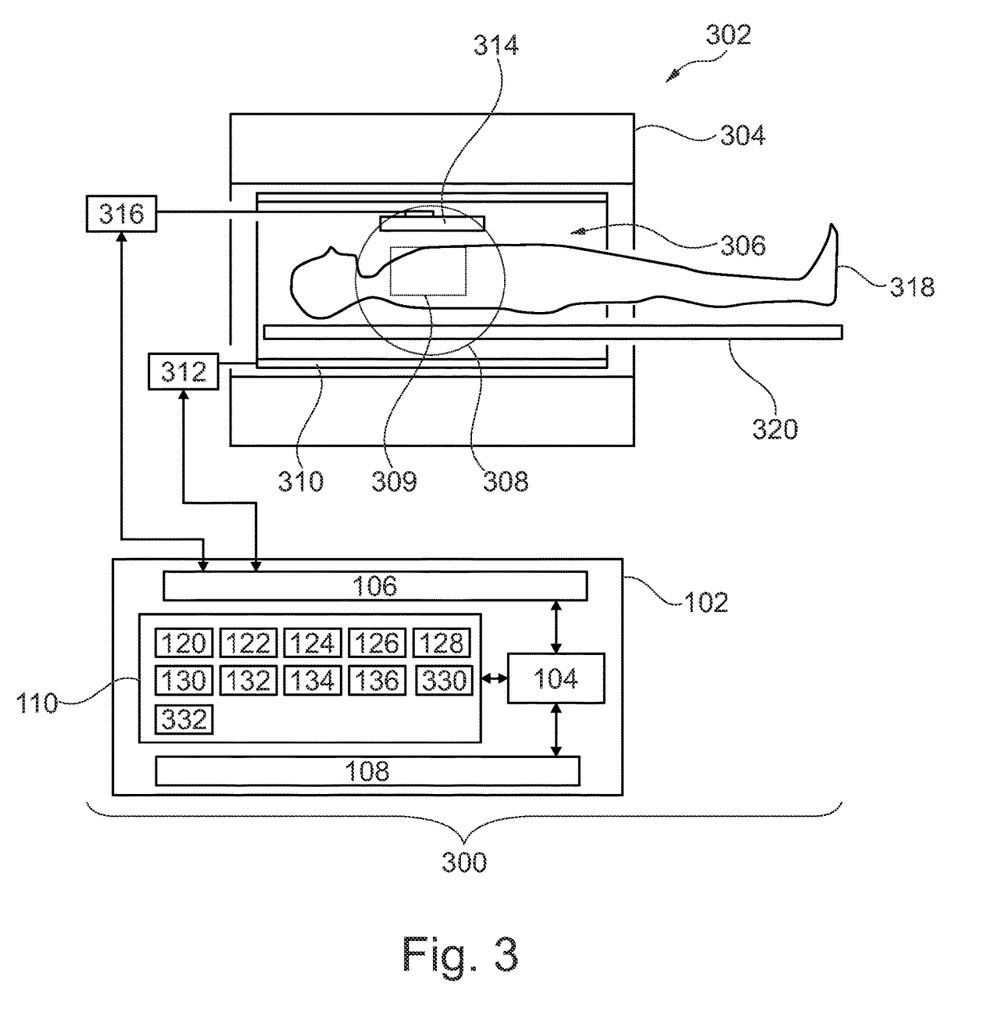
FIG. 3 illustrates an example of a medical instrument.

FIG. 3 illustrates a further example of a medical system 300. The medical system 300 depicted in FIG. 3 is similar to the medical system 100 depicted in FIG. 1 except that it additionally comprises a magnetic resonance imaging system 302 that is controlled by the computational system 104.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the magnet 304, which may be cylindrical as shown, there is an imaging zone 308 where the magnetic field is strong and uniform enough to perform magnetic resonance imaging. A region of interest 309 is shown within the imaging zone 308. The magnetic resonance data that is acquired typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the radio frequency transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements.

The radio frequency transceiver 316 and the magnetic field gradient coil power supply 312 are shown as being connected to the hardware interface 106 of the computer 102.

The memory 110 is shown as containing a magnetic resonance finger printing pulse sequence 330. A pulse sequence is a set of commands or data which can be converted into commands which can be used to control the magnetic resonance imaging system 302 to acquire k-space data 122.

The magnetic resonance fingerprinting pulse sequence 330 is configured for encoding chemical shifts. The computational system is configured to use the magnetic resonance fingerprinting pulse sequence 330 to control the magnetic resonance imaging system to acquire the k-space data 122 from the region of interest 309. The memory is further shown as containing an optional magnetic resonance spectroscopy measurement 332 that was acquired with the k-space data 122. The magnetic resonance spectroscopy measurement 332 may be used to calculate the fat peak weights 126.

Figure 4:
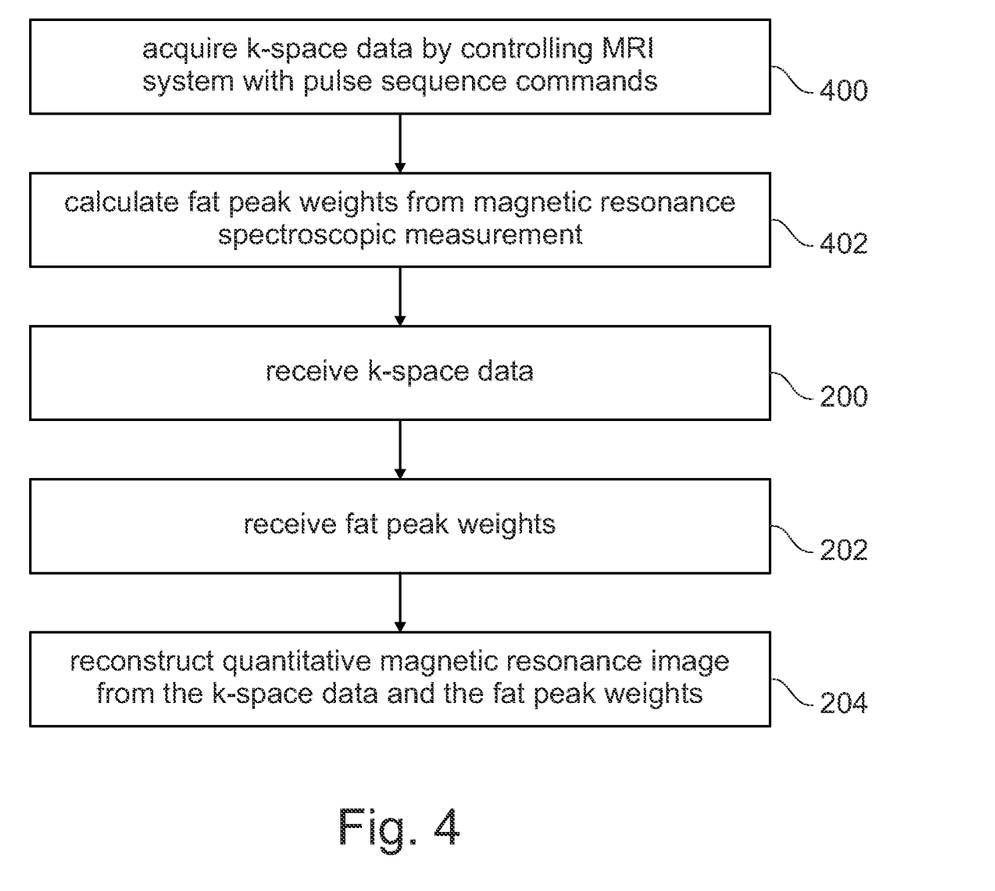
FIG. 4 shows a flow chart which illustrates a method of using the medical instrument of FIG. 1.

FIG. 4 shows a flowchart which illustrates a method of operating the medical system 300 of FIG. 3. The method starts with the step 400. In step 400 the magnetic resonance fingerprinting pulse sequence 330 is used to control the magnetic resonance imaging system 302 to acquire the k-space data 122. Several options exist here. In one option, the fat peak weights 126 associated with the magnetic resonance fingerprinting pulse sequence 330 have already been acquired. In this case the method steps directly to step 200 as is illustrated in FIG. 2 and steps 200, 202 and 204 are performed. In another option the magnetic resonance fingerprinting pulse sequence 330 is also configured to cause the magnetic resonance fingerprinting pulse sequence 330 to control the magnetic resonance imaging system 302 to acquire the magnetic resonance spectroscopy measurement 332. If the magnetic resonance fingerprinting pulse sequence 330 has been used to acquire the magnetic resonance spectroscopy measurement 332 then step 402 is performed. In step 402, the fat peak weights are calculated from the at least one magnetic resonance spectroscopy measurement 332. After step 402 is performed, the method then proceeds to steps 200, 202, and 204 as is illustrated in FIG. 2.

The spectral complexity of fat can induce quantification errors when acquiring k-spaced data using a magnetic resonance fingerprinting pulse sequence configured for encoding chemical shifts in tissues close to fat or in organs containing fat. A specific example would be when performing Dixon-MRF. Examples may enable correction for the spectral complexity of fat in Dixon-MRF by appropriately pre-calibrating the fat fingerprints during the train of the Dixon-MRF acquisition.

Examples may relate to multi-parametric body MRI using Magnetic Resonance Fingerprinting (MRF). In particular, examples may correctly account for the effect of multi-peak fat spectrum in MRF-based relaxometry of tissues containing fat or being spatially located close to fat.

Fat suppression remains a major consideration when translating MRF techniques from the brain to the body. The combination of MRF with chemical shift encoding-based water-fat imaging (Dixon) imaging in the so-called Dixon-MRF paradigm has been recently reported in the literature.

Fat encloses protons at different chemical locations along the fatty acid chain with distinct chemical shifts. Traditional Dixon techniques for quantitative chemical shift encoding-based water-fat separation rely on a pre-calibrated fat spectrum to address the multi-peak nature of the proton density-weighted fat spectrum.

In a Dixon-MRF experiment the separation of the water and fat components would formally require the knowledge of T1 and T2 relaxation times of the different fat peaks. However, there is contradicting literature on the T1 and T2 relaxation of the different fat peaks, primarily due to the effect that many of the peaks in the chain of the fatty acids show J-couplings. Existing Dixon-MRF methods perform either first water-fat separation and then dictionary matching by considering the water-fat separation and dictionary matching steps separable or try to create water-fat dictionaries based on a single peak fat model. Approaches that perform first the water-fat separation and then dictionary matching assume the same constant pre-calibrated fat spectrum model across the MRF flip angle train and the approaches that create water-fat dictionaries based on the single peak fat model totally neglect the fat spectral complexity.

Examples may provide a methodology for experimentally pre-calibrating the fat fingerprints for a given MRF sequence and therefore addressing the effect of the fat spectrum complexity in Dixon-MRF.

Magnetic Resonance Fingerprinting is an emerging quantitative imaging technique enabling the multi-parametric analysis of different issues. The translation of the technique from the brain to the body requires the efficient suppression of fat signals. Traditional fat suppression techniques are typically inefficient in MRF acquisitions and Dixon-MRF has already shown promising results in different tissues. Accurate modelling of the fat signal in Dixon-MRF is important not only when using spatial encoding techniques with long readout gradients (e.g., spirals) but also when using spatial encoding techniques with short readout gradients (e.g. radial spokes). The incorrect modelling of the fat signal in Dixon MRF can induce quantification errors (a) in water-dominant tissues surrounded by fat, due to fat blurring effects when long gradient readouts are being used and (b) in tissues containing both water and fat (e.g., bone marrow, breast, fatty infiltrated liver, pancreas, kidney, skeletal muscle, myocardium) for any type/duration of gradient readout.

Note that we have introduced a T2-prepared MRS acquisition for the needs of characterizing the effect of fat suppression with SPAIR on T2-prepared 3D TSE in and that we have proposed a T2-prepared MRS acquisition for the needs of fat spectrum pre-calibration in T2 mapping using T2-prepared 3D TSE in.

We propose a method for experimentally pre-calibrating the fat fingerprint for a specific MRF sequence by adding the MRF sequence as a preparation module to a Magnetic Resonance Spectroscopy (MRS) sequence. The MRF sequence preparation module will be repeated for the different instances (acquisition time points) of the MRF sequence and a spectrum will be acquired using a single-voxel MRS localization technique (e.g., STEAM or PRESS) at the subcutaneous fat and the yellow bone marrow region. An MR fat spectrum will be then available at each sequence instance of the MRF acquisition (sometimes referred to as MRFi) and a pre-calibration constant will be extracted for each fat peak at each TR of the MRF acquisition.

Detailed description of how to build and use the invention Examples may contain one or more of the following workflow features':

- Use a single-voxel MRS sequence (e.g., STEAM) or non-selective MRS sequence (e.g. hard pulse excitation)
- Use the MRF sequence train as a preparation module followed by the MRS sequence (cf. FIG. 5 below)
- Measure the MRF-prepared MRS signal at different instances of the MRF train by applying a magnitude stabilizing gradient and a tip-up module in combination with a spectroscopy sequence (cf. FIG. 5 below).
- Perform the spectra quantification, e.g., time-domain-based peak fitting
- Derive a real-valued pre-calibrated fat spectrum per measured TR in the MRF sequence train
- Estimate or model the remaining pre-calibration fat spectra for each instance in the MRF sequence train (measured and not measured with the spectroscopy sequence)
- Employ the derived pre-calibrated fat spectrum per MRF sequence instance in the Dixon-MRF reconstruction The pre-calibration of the MRF fat spectrum can be experimentally performed for different MRF sequence trains (flip angle, TR trains) and should be in general compatible for any arbitrary MRF sequence train. Since the signal model for the MRF fat spectrum is not known, the presented methodology remains unique in its ability to correctly model the fat spectrum during the MRF sequence train, accounting for differences in T1 and T2 for the different fat peaks and J coupling effects.

Figure 5:
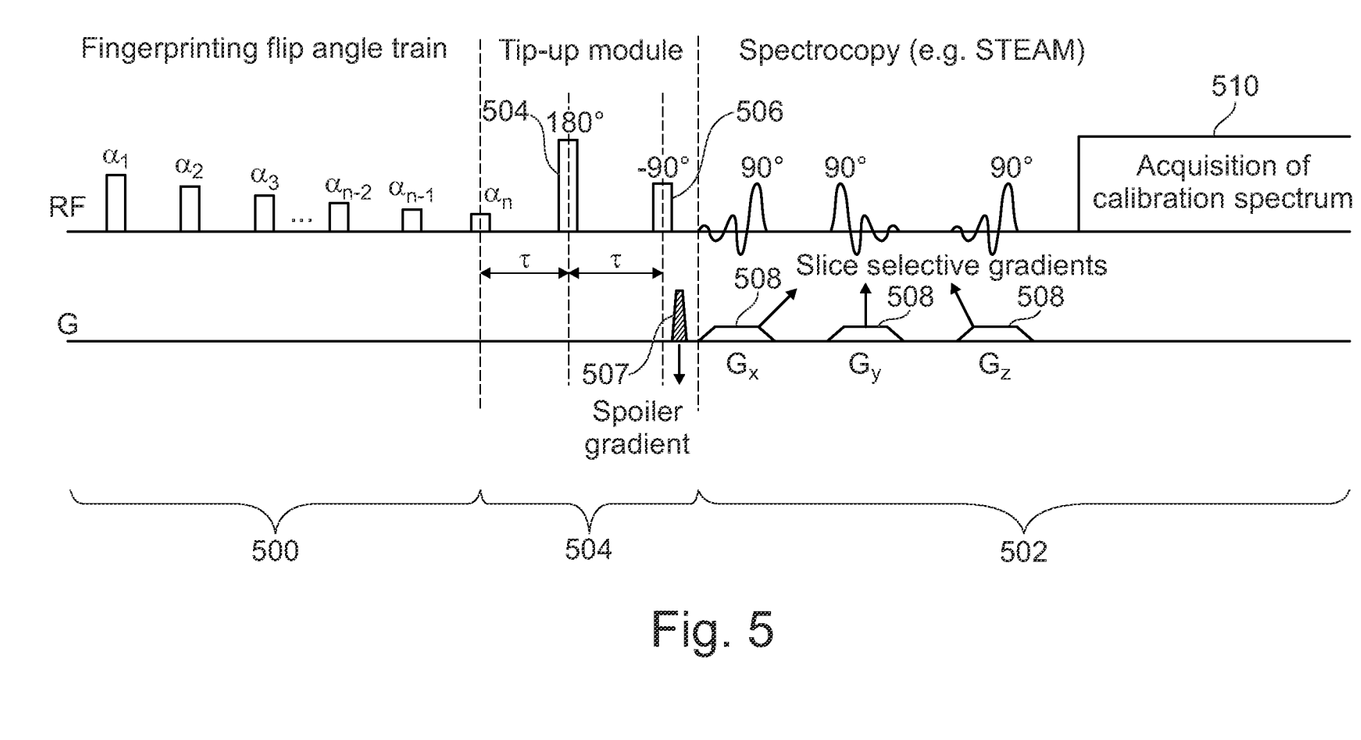
FIG. 5 shows a timing diagram illustrating an example of a magnetic resonance fingerprinting pulse sequence.

FIG. 5 shows one repetition of the magnetic resonance fingerprinting pulse sequence 330. The portion of the magnetic resonance fingerprinting pulse sequence 330 which excite a spatially selected excitation volume are not shown. The magnetic resonance fingerprinting pulse sequence 330 comprises a magnetic resonance fingerprinting flip angle trained portion 500. After this there is a spectroscopic measurement portion 502 that in this example uses the STEAM spectroscopic method. In this example there are a number of slice selective gradients 508 which can be used to make the spectroscopic measurement within a chosen volume. It is also possible to leave out the slice selective gradients and form a non-spatially selective measurement. For example, the excitation volume for the fingerprinting flip angle train could be used. After the slice selective gradients 508 there is the acquisition of the calibration spectrum 510. Between the fingerprinting flip angle train and the spectroscopic measurement portion 502 there is a tip-up module 504 that comprises a refocusing pulse performed at a delay of t after the last of the fingerprinting pulse train. After the refocusing pulse 504 a tip-up pulse 506 is performed after a further delay of t. A spoiler gradient 507, a spoiler magnetic gradient pulse, is then performed after the tip-up pulse 506.

Dixon MRF is essential for removing the confounding effect of fat from multi-parametric MRF of most body organs including bone marrow, breast, liver, pancreas, kidney, skeletal muscle, myocardium. The invention would be particularly important in correctly estimating multi-parametric MRF parameters for the water component in tissues containing both water and fat like the breast, the bone marrow and the liver. In summary, the invention is an important step towards increasing the quantification robustness of MRF in the presence of fat across body organs.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

REFERENCE SIGNS LIST 100 medical system
102 computer
104 computational system
106 hardware interface
108 user interface
110 memory
120 machine executable instructions
122 k-space data
124 optional meta data
126 fat peak weights
128 fat peak weights database
130 image reconstruction module
132 quantitative magnetic resonance image
134 set of magnetic resonance fingerprints
136 magnetic resonance fingerprinting dictionary
200 receive k-space data descriptive of a region of interest of a subject
202 receive fat peak weights descriptive of a magnetic resonance fat spectrum
204 reconstruct a quantitative magnetic resonance image from the k-space data and the fat peak weights
300 medical system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
330 magnetic resonance fingerprinting pulse sequence
332 magnetic resonance spectroscopic measurement 400 control the magnetic resonance imaging system to acquire the k-space data
402 calculate the fat peak weights from the at least one magnetic resonance spectroscopic measurement
500 magnetic resonance fingerprinting flip angle train
502 magnetic resonance spectroscopy portion
504 tip-up module
505 refocusing pulse
506 tip-up pulse
507 spoiler gradient pulse
508 slice selective gradient
510 magnetic resonance spectroscopy readout sequence

The invention claimed is:

1. A medical system comprising:
a memory storing machine executable instructions;
a computational system, wherein execution of the machine executable instructions causes the computational system to:
receive k-space data descriptive of a region of interest of a subject, wherein the k-space data is acquired using a magnetic resonance fingerprinting pulse sequence configured for encoding chemical shifts; said magnetic resonance fingerprinting pulse sequence involving acquisition of a pulse train of multiple MRF signal train segments,
receive fat peak weights descriptive of a magnetic resonance fat spectrum, for respective MRF signal train segments so that the fat peak weights are matched to the MRF signal train segments of the pulse train of the magnetic resonance fingerprinting pulse sequence; and
reconstruct a quantitative magnetic resonance image from the k-space data and the fat peak weights.

2. The medical system of claim 1, wherein the medical system further comprises a magnetic resonance imaging system, wherein the memory further stores the magnetic resonance fingerprinting pulse sequence, wherein execution of the machine executable instructions further causes the computational system to control the magnetic resonance imaging system with the magnetic resonance fingerprinting pulse sequence to acquire the k-space data.

3. The medical system of claim 2, wherein the magnetic resonance fingerprinting pulse sequence is further configured to acquire at least one magnetic resonance spectroscopic measurement during the acquisition of the k-space data from a measurement volume within the region of interest by performing a magnetic resonance spectroscopy readout sequence, wherein execution of the machine executable instructions further causes the computational system to calculate the fat peak weights from the at least one magnetic resonance spectroscopic measurement.

4. The medical system of claim 3, wherein the measurement volume is a single voxel, wherein the magnetic resonance spectroscopy readout sequence is a single-voxel magnetic resonance spectroscopy readout sequence.

5. The medical system of claim 3, wherein the magnetic resonance fingerprinting pulse sequence is configured to excite a spatially selective excitation volume during acquisition of the k-space data, wherein the measurement volume is the entire excitation volume, wherein the magnetic resonance spectroscopy readout sequence is a non-spatially selective magnetic resonance spectroscopy readout sequence that averages the entire spatially selective excitation volume.

6. The medical system of claim 3, wherein the magnetic resonance fingerprinting pulse sequence is configured such that at least one pulse train is followed by the magnetic resonance imaging spectroscopy readout sequence.

7. The medical system of claim 6, wherein the magnetic resonance fingerprinting pulse sequence is further configured for executing a tip-up module between the pulse train and the magnetic resonance imaging spectroscopy readout sequence.

8. The medical system of claim 2, wherein the magnetic resonance fingerprinting pulse sequence is configured for acquiring the k-space data as groups of k-space data, wherein the magnetic resonance fingerprinting pulse sequence is configured for acquiring the magnetic resonance imaging spectroscopic measurement fewer times than the number of groups of k-space data, wherein execution of the machine executable instructions further causes the computational system to estimate the set of fat peak weights for the groups of the k-space data which do not comprise the magnetic resonance imaging spectroscopic measurement.

9. The magnetic resonance imaging system of claim 1, wherein execution of the machine executable instructions further causes the processor to receive the fat peak weights by retrieving it from a fat peak weights database.

10. The medical system of claim 1, wherein the memory further contains a magnetic resonance fingerprinting dictionary for one or more intrinsic properties of the subject, wherein execution of the machine executable instructions further causes the computational system to reconstruct the quantitative magnetic resonance image from the k-space data and the fat peak weights by:
providing a set magnetic resonance fingerprints for the region of interest by reconstructing a sequence of images from the k-space data using and set of fat peak weights;
calculating a spatially dependent map for at least one of the intrinsic properties by matching the set of chemical shift encoding-sensitive magnetic resonance fingerprints to the magnetic resonance fingerprinting dictionary; and
providing the spatially dependent map as the quantitative magnetic resonance image.

11. The medical system of claim 10, wherein the sequence of images is a sequence of fat and water images reconstructed according to a Dixon magnetic resonance imaging protocol.

12. The medical system of claim 1 wherein the quantitative magnetic resonance image is reconstructed from the k-space data and the fat peak weights directly by performing any one of the following:
solving a non-linear inversion of the k-space data that is consistent with Bloch's equation and Faraday's law; and
receiving the quantitative magnetic resonance image in response to inputting the k-space data and the fat peak weights into a neural network.

13. The medical imaging system of claim 1, wherein the magnetic resonance fingerprinting pulse sequence is a Dixon magnetic resonance fingerprinting pulse sequence.

14. A computer program comprising machine executable instructions stored on a non-transitory computer readable medium for execution by a computational system, wherein execution of the machine executable instructions causes the computational system to:
receive k-space data descriptive of a region of interest of a subject, wherein the k-space data is acquired using a magnetic resonance fingerprinting pulse sequence configured for encoding chemical shifts; said magnetic resonance fingerprinting pulse sequence involving acquisition of a pulse train of multiple MRF signal train segments, receive fat peak weights descriptive of a magnetic resonance fat spectrum, wherein the fat peak weights for respective MRF signal train segments so that the fat peak weights are matched to the MRF signal train segments of the pulse train of the magnetic resonance fingerprinting pulse sequence; and reconstruct a quantitative magnetic resonance image from the k-space data and the fat peak weights.

15. The computer program of claim 14, wherein execution of the machine executable instructions further causes the processor to receive the fat peak weights by retrieving it from a fat peak weights database.

16. The computer program of claim 14, wherein the memory further contains a magnetic resonance fingerprinting dictionary for one or more intrinsic properties of the subject, wherein execution of the machine executable instructions further causes the computational system to reconstruct the quantitative magnetic resonance image from the k-space data and the fat peak weights by:

providing a set magnetic resonance fingerprints for the region of interest by reconstructing a sequence of images from the k-space data using and set of fat peak weights;

calculating a spatially dependent map for at least one of the intrinsic properties by matching the set of chemical shift encoding-sensitive magnetic resonance fingerprints to the magnetic resonance fingerprinting dictionary; and providing the spatially dependent map as the quantitative magnetic resonance image.

17. The computer program of claim 16, wherein the sequence of images is a sequence of fat and water images reconstructed according to a Dixon magnetic resonance imaging protocol.

18. The computer program of claim 14, wherein the quantitative magnetic resonance image is reconstructed from the k-space data and the fat peak weights directly by performing any one of the following:

solving a non-linear inversion of the k-space data that is consistent with Bloch's equation and Faraday's law; and receiving the quantitative magnetic resonance image in response to inputting the k-space data and the fat peak weights into a neural network.

19. The computer program of claim 14, wherein the magnetic resonance fingerprinting pulse sequence is a Dixon magnetic resonance fingerprinting pulse sequence.

20. A method of medical imaging, wherein the method comprises:

receiving k-space data descriptive of a region of interest of a subject, wherein the k-space data is acquired using a magnetic resonance fingerprinting pulse sequence configured for encoding chemical shifts said magnetic resonance fingerprinting pulse sequence involving acquisition of a pulse train of multiple MRF signal train segments;

receiving fat peak weights descriptive of a magnetic resonance fat spectrum for respective MRF signal train segments, wherein the fat peak weights for respective MRF signal train segments so that the fat peak weights are matched to the MRF signal train segments of the pulse train of the magnetic resonance fingerprinting pulse sequence; and reconstructing a quantitative magnetic resonance image from the k-space data and the fat peak weights.

* * * * *